(12) United States Patent
Maa et al.

(10) Patent No.: US 6,221,689 B1
(45) Date of Patent: *Apr. 24, 2001

(54) METHOD FOR IMPROVING THE RELIABILITY OF UNDERFILL PROCESS FOR A CHIP

(75) Inventors: Chong-Ren Maa; Albert Lin; Jin-Chyuan Biar, all of Taipei (TW)

(73) Assignee: Apack Technologies Inc., Hsinchu (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/957,449

(22) Filed: Oct. 24, 1997

(51) Int. Cl.[7] .......................... H01L 21/44; H01L 21/48; H01L 21/50
(52) U.S. Cl. .......................... 438/106; 438/118; 438/127
(58) Field of Search .................... 438/106, 118, 438/127

(56) References Cited

U.S. PATENT DOCUMENTS

| 5,777,391 | * | 7/1998 | Nakamura et al. . |
| 5,919,329 | * | 7/1999 | Banks et al. . |
| 5,940,688 | * | 8/1999 | Higuchi et al. . |

OTHER PUBLICATIONS

Tummala, Rao et al., Microelectronics Packaging Handbook, Chapman & Hall, I–493, 1997.*

* cited by examiner

Primary Examiner—Jey Tsai
Assistant Examiner—Josetta Jones
(74) Attorney, Agent, or Firm—Pillsbury Madison & Sutro LLP

(57) ABSTRACT

A hole is generated in a substrate. A chip is connected to the substrate by using the chip receiving area of the substrate by using flip chip assembly. The hole is aligned to the chip receiving area of the substrate. Then, a underfill process is performed such that the space between the chip and the substrate will be encapsulated using liquid capsulated material. The liquid capsulated material is injected into the hole from the back side surface of the substrate to the front side surface of the substrate.

9 Claims, 4 Drawing Sheets

METHOD FOR IMPROVING THE RELIABILITY OF UNDERFILL PROCESS FOR A CHIP

FIELD OF THE INVENTION

The present invention relates to integrated circuits manufacture, and more specifically, to an improved method of underfill process for a semiconductor chip.

BACKGROUND OF THE INVENTION

Integrated circuits industry and fabrication involve the formation of semiconductor wafers, integrated circuits and chip package. With the advent of Ultra Large Scale Integrated (ULSI) circuits technologies, it has been a trend to scale down the geometry dimension of semiconductor devices and increase the density of semiconductor devices per unit area of silicon wafer. Thus, the sizes of devices, such as memory cells, have gotten smaller and smaller such that the area available for a single device has become very small. For example, the area for forming a dynamic random access memory cell has reduced to sub-micron meter range for achieving higher chip density. Further, the manufacturers of the devices are striving to reduce the sizes while simultaneously increasing their speed.

Developments in interconnect and packing have been quite modest in comparison. The renewed interest in high density hybrid is driven by the requirement to handle large numbers of IC interconnections, the increasing clock rate of digital systems and the desire to pack greater functionality into smaller spaces. Therefore, the number of a package's leads becomes more and more.

Typically, a chip can be connected to a substrate using a method called flip chip assembly. First, in the flip chip assembly, a plurality of metal bumps are formed on bonding pads of the chip. Then, the chip is flipped such that the metal bumps are aligned to the bonding pads of a substrate. Using a thermal pressure process, the metal bumps are connected to the bonding pad of the substrate. However, in many cases, stress is generated between the interface of metal bump and chip, and the interface between the substrate and the metal bump due to the mismatch of the coefficients of thermal expansion (CTE).

One of the ways to solves the problem associated with the CTE mismatch is underfill process. As shown in FIG. 1, in the conventional underfill process, encapsulating material 8 is filled in the space among the chip 4, the substrate 2 and the metal bumps 6. How the encapsulating material 8 is filled under the chip 4 will be described as follows. Turning to FIGS. 2A and 2B, initially, the chip 4 is connected to the substrate 2 using aforementioned method. Then, the encapsulating material 8 is coated at the one or two side(s) of the chip 4 by using supplying means 10. Typically, the encapsulating material 8 is a kind of liquid encapsulating material. Referring to FIG. 2C and 2D, the liquid encapsulating material 8 will flow and fill into the space between the chip 4 and the substrate 2 due to the capillary action. The flowing directions of the liquid encapsulating material 8 are indicated by arrows in FIG. 2C and 2D. Because the density of the metal bumps formed on the chip 4 is not uniform, air may be trapped under the chip 4 during the liquid encapsulating process. Thus, voids will be generated in the liquid encapsulating material 8 that is under the chip. This results the reliability of the semiconductor chip. Further, in order to achieve the purpose of coating the liquid encapsulating material 8 on the substrate 2, the space between chips must be large enough for coating the liquid encapsulating material 8. Thus, it limits the increase of density of semiconductor chips 4 per unit area of the substrate 2. In addition, the flowing path of the liquid encapsulating material 8 is too long for the underfill process. Assume that the dimension of the chip 4 is "a". Then, the longest flowing path of the liquid encapsulating material 8 is about root means square of a.

Turning to FIG. 1, the liquid encapsulating material 8 includes non-organic material 8a that will stay at the bottom of the liquid encapsulating material 8. The other compounds, such as organic polyimide 8b is on the non-organic material 8a. That is because that the density of the non-organic material 8a is highest than other compounds in the liquid encapsulating material 8. In another words, the organic polyimide 8b is adjacent to the chip 4 and the non-organic material 8a is located on the substrate 2. Generally speaking, the substrate2 is composed of Fr4 printed circuit board (PCB). The CTE of the substrate 2 is about 20–30 ppm/centigrade, and the CTE of the non-organic material 8a is about 7 ppm/centigrade. Further, the CTEs of the chip 4 and the organic polyimide 8b are about 2.5 and 50–60 ppm/centigrade, respectively. Therefore, the problem associated with the CTE mismatch is serious in the conventional structure. The chip 4 or the liquid encapsulating material 8 will be delamination from the substrate 2.

What is required is a method to reduce the CTE problem and to increase the reliability of the underfill process for a chip.

SUMMARY OFD THE INVENTION

A hole is generated in a first major surface of the substrate. A chip will formed in the chip receiving area of the substrate. The chip receiving area is on the second major surface of the substrate. The hole is formed and aligned to the chip receiving area of the substrate. In a preferred embodiment, the hole is formed aligned to the center of the chip receiving area. Next, the chip is connected to the second major surface of the substrate by using flip chip assembly. Then, a underfill process is performed such that the space between the chip and the substrate will be encapsulating using liquid encapsulating material. The liquid encapsulating material is injected into the hole from the first major surface of the substrate to the second major surface ofthe substrate. The liquid encapsulating material will flow and fill into the space between the chip and the substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
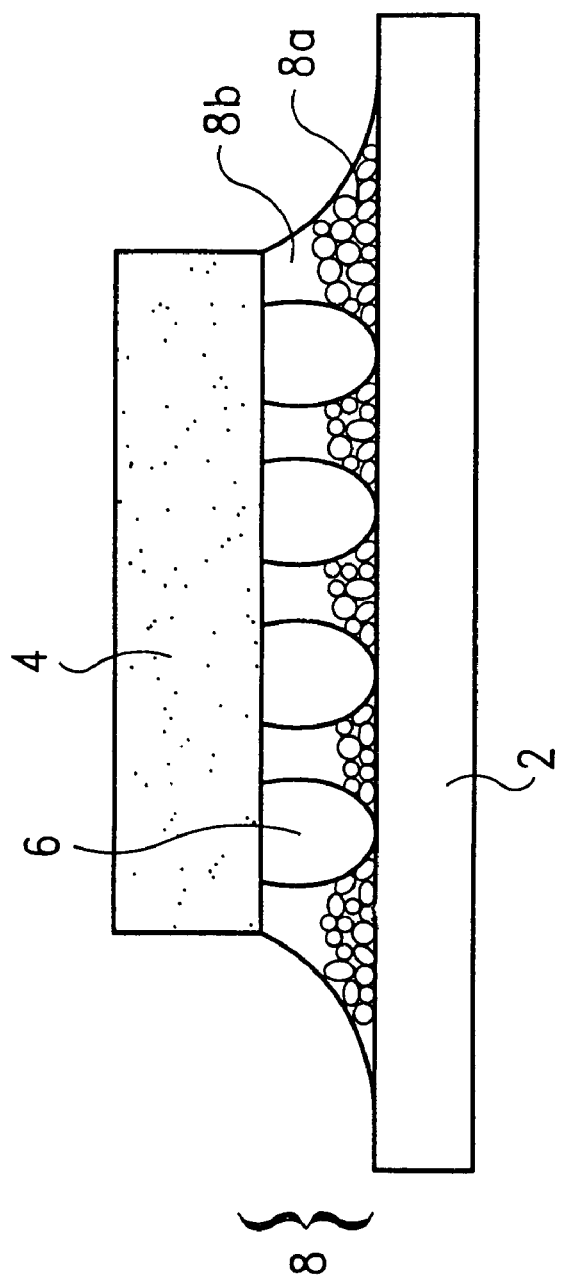
FIG. 1 is a cross section view of a structure of a prior art.
Figure 2A:
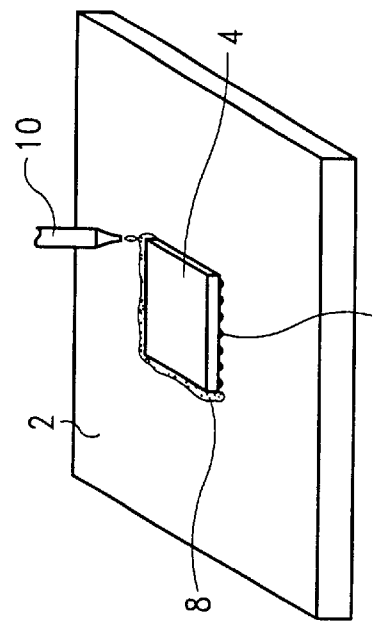
FIG. 2A is a drawing illustrating the step of liquid encapsulating material coated on a substrate in accordance with the first embodiment of prior art.
Figure 2B:
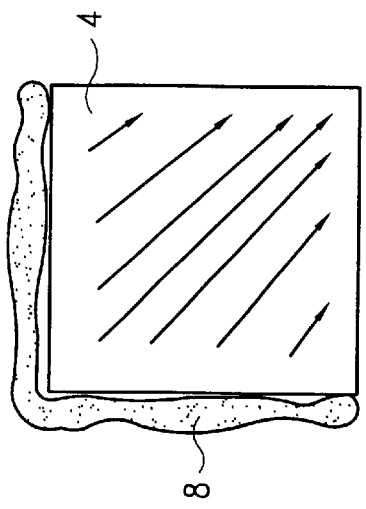
FIG. 2B is a drawing illustrating the step of liquid encapsulating material coated on a substrate in accordance with the second embodiment of prior art.
Figure 2C:
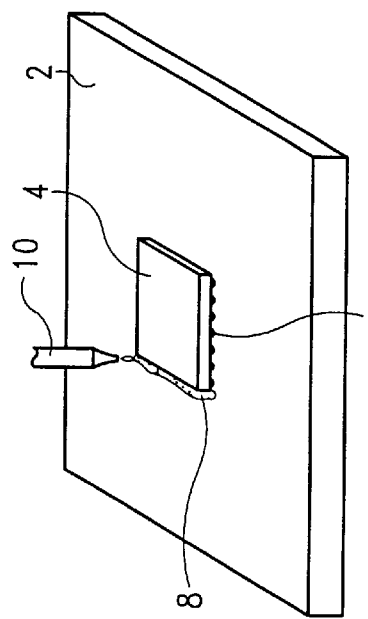
FIG. 2C is a drawing illustrating the flowing direction of the liquid encapsulating material in accordance with the first embodiment of prior art.
Figure 2D:
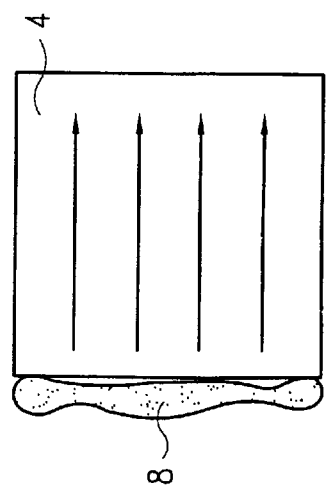
FIG. 2D is a drawing illustrating the flowing direction of the liquid encapsulating material in accordance with the second embodiment of prior art.
Figure 3A:
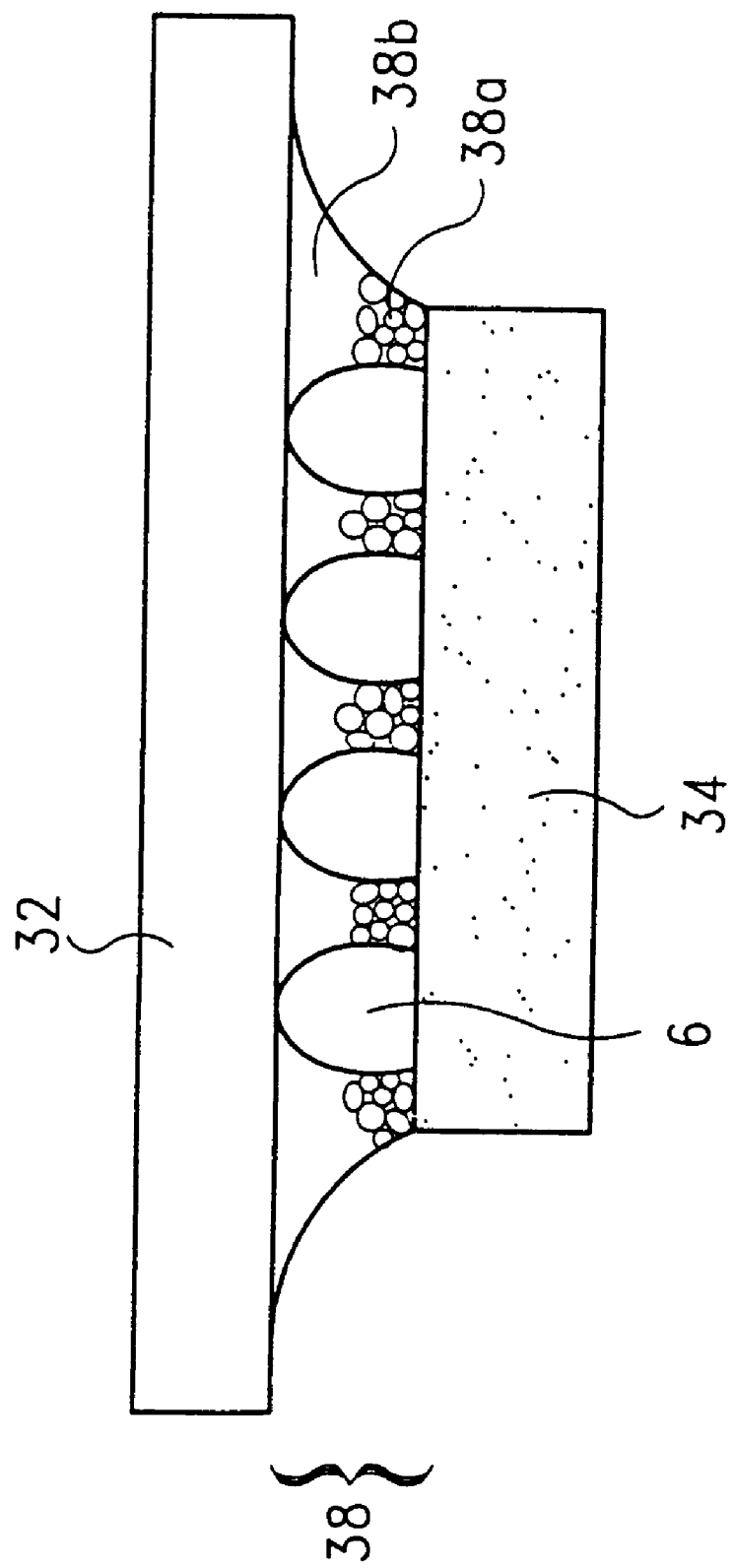
FIG. 3A is a cross section view of a structure in accordance with the present invention.
Figure 3C:
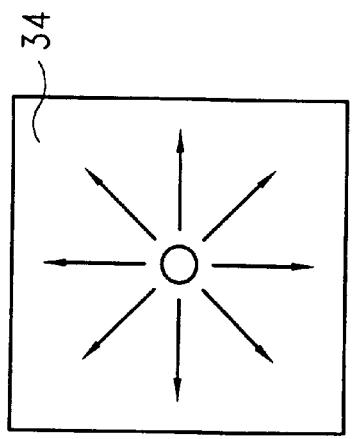
FIG. 3C is a drawing illustrating the flowing direction of the liquid encapsulating material in accordance with the present invention.

The present invention discloses a way of increasing the reliability and reducing the mismatch of CTE of a underfill process for a semiconductor chip. Referring to FIG. 3C, at least one hole 42 is generated in a first major surface of the substrate. The first major surface indicates the back side surface of the substrate 32. Similarly, the second major surface indicates the front side surface of the substrate that is used to receive the chip 44. As shown in FIG. 3A, the area 44 in the dash line of the FIG. 3A represents the chip receiving area on the second major surface. Namely, the chip will formed in the chip receiving area 44. Preferably, the hole 42 is formed and aligned to the chip receiving area 44 of the substrate 32 using any suitable method. In fact, the hole 42 is formed in the chip receiving area. It will make sure that the hole 42 will be aligned to a portion of the chip 34. In fact, the hole 42 can be formed anywhere in the substrate 32 that is aligned to the chip receiving area 44. In a preferred embodiment, the hole 42 is formed aligned to the center of the chip receiving area 44.

Subsequently, the chip 34 is connected to the second major surface of the substrate 32 by using flip chip assembly. To phrase in another way, a plurality of metal bumps 46 for electrical connection formed on the bonding pads of the chip are aligned to the bonding pads of a substrate 32. Then, the metal bumps of the chip 34 are connected to the bonding pad of the substrate 32 by using a thermal pressure process. As well known in the art, the bonding pads of the substrate 32 are used for electrical connection. The step after the chip 34 is connected to the substrate is to encapsulate the space between the chip 34 and the substrate 32 using non conductive material 38. Preferably, liquid encapsulating material is used to serve as the 38 non conductive material 38.

Figure 3B:
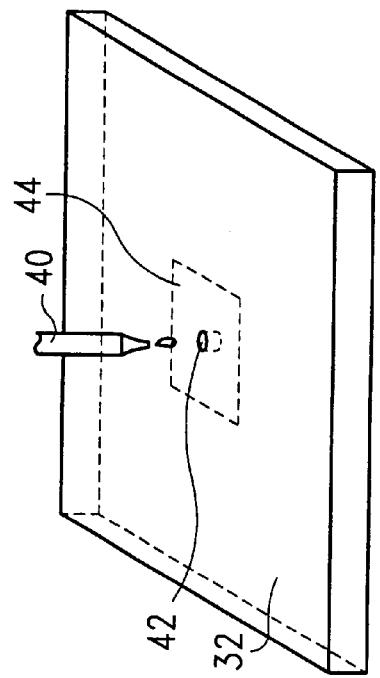
FIG. 3B is a drawing illustrating the step of liquid encapsulating material coated on a substrate in accordance with the present invention.

It have to be noted that the liquid encapsulating material 38 is injected into the hole 42 from the first major surface (back side surface) of the substrate 32 to the second major surface of the substrate 32, as shown in FIG. 3B. The liquid encapsulating material 38 is dropped in to the hole 42 by using supplying means 40. Typically, the liquid encapsulating material is composed of dielectric or polyimide. Then, because of the capillary action so that the liquid encapsulating material 38 will flow and fill into the space between the chip 34 and the substrate 32. The flowing directions of the liquid encapsulating material 40 are indicated by arrows in FIG. 3C.

In FIG. 3C, preferably, the liquid encapsulating material 38 radically flows from the center of the chip receiving area 44 to the sides of the area 44. The longest flowing path of the liquid encapsulating material 38 is half of the one according to the prior art. Thus, the time of the underfill process according to the present invention is shorter than that of prior art, and it will increase the throughput of fabrication. Because the flowing direction of the liquid encapsulating material 38 is radial from the center to the sides of the chip receiving area 44. Thus, air will not be trapped between the chip 34 and substrate 32 during the liquid encapsulating process.

As is known, the liquid encapsulating material 38 includes non-organic material 38a and organic polyimide 38b. The non-organic material 38a having CTE about 7 ppm/centigrade will be adjacent to the interface of the chip 34. The CTE of the chip 34 is about 2.5 ppm/centigrade. The organic polyimide 38b is adjacent to the substrate 32 and the CTE of them are respectively 50–60 ppm/centigrade, 20–30 ppm/centigrade. Therefore, the problem associated with the CTE mismatch will be reduced by the present invention.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. Thus, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of underfill for a chip, said method comprising:

providing a substrate having at least one hole formed therein, wherein said substrate has a first surface and a second surface, a chip receiving area being on said second surface of said substrate, a plurality of bonding pads being formed on said second surface of said substrate for electrical connection;

connecting a chip on said second surface and in said chip receiving area of said substrate by using a thermal pressure process, wherein said chip is connected to said substrate by using a plurality of metal bumps on said chip connecting to said bonding pads of said substrate; and injecting non conductive material including a liquid encapsulating material via said hole from said first surface to said second surface for encapsulating a space between said substrate and said chip, wherein said liquid encapsulating material includes a non-organic material and an organic material, wherein said substrate has a first thermal coefficients of expansion (CTE), said chip has a second CTE, said non-organic material and said organic material have a third CTE and a fourth CTE, respectively, wherein said fourth CTE is greater than said first CTE, said first CTE is greater than said third CTE, and said third CTE is greater than said second CTE.

2. The method of claim 1, wherein said hole is formed and aligned to said chip receiving area.

3. The method claim 1, wherein said non conductive material is liquid encapsulating material.

4. A method of underfill for a chip, said method comprising:

providing a substrate having at least one hole formed therein, wherein said substrate has a third surface and a fourth surface, a chip receiving area being on said fourth surface of said substrate, wherein said hole is aligned to said chip receiving area, and a plurality of bonding pads being formed on said fourth surface of said substrate for electrical connection;

connecting a chip on said fourth surface and in said chip receiving area of said substrate by using a thermal pressure process, wherein said chip is connected to said substrate by using a plurality of metal bumps on said chip connecting to said bonding pads of said substrate; and injecting liquid encapsulating material including a liquid encapsulating material via said hole from said third surface to said fourth surface for encapsulating a space between said substrate and said chip, wherein said substrate has a thermal coefficient of expansion (CTE) of about 20–30 ppm/centigrade, said chip having a CTE of about 2.5 ppm/centigrade, said non-organic material and said organic material having a CTE of about 7 ppm/centigrade and 50–60 ppm/centigrade, respectively.

5. The method of claim 4, wherein said liquid encapsulating material includes a non-organic material and an organic material.

6. A method of underfill for a chip, said method comprising:

providing a substrate having at least one hole formed therein, wherein said substrate has a back side surface and a front side surface, a chip receiving area being on said front side surface of said substrate, a plurality of bonding pads being formed on said front side surface of said substrate for electrical connection;

connecting a chip on said front side surface and in said chip receiving area of said substrate by using a thermal pressure process, wherein said chip is connected to said substrate by using a plurality of metal bumps on said chip connecting to said bonding pads of said substrate; and injecting non conductive material via said hole from said back side surface to said front side surface for encapsulating a space between said substrate and said chip, wherein said liquid encapsulating material includes a non-organic material and an organic material, wherein said substrate has a first thermal coefficient of expansion (CTE), said chip having a second CTE, said non-organic material and said organic material having a third CTE and a fourth CTE, respectively, wherein said fourth CTE is greater than said first CTE, said first CTE being greater than said third CTE, and said third CTE being greater said second CTE.

7. The method of claim 6, wherein said hole is formed and aligned to said chip receiving area.

8. The layout of claim 6, wherein said non conductive material is liquid encapsulating material.

9. A method of underfill for a chip, said method comprising:

providing a substrate having at least one hole formed therein, wherein said substrate has a back side surface and a front side surface, a chip receiving area being on said front side surface of said substrate, wherein said hole is aligned to said chip receiving area, and a plurality of bonding pads being formed on said front side surface of said substrate for electrical connection;

connecting a chip on said front side surface and in said chip receiving area of said substrate by using a thermal pressure process, wherein said chip is connected to said substrate by using a plurality of metal bumps on said chip connecting to said bonding pads of said substrate; and injecting liquid encapsulating material via said hole from said back side surface to said front side surface for encapsulating a space between said substrate and said chip, wherein said liquid encapsulating material includes a non-organic material and an organic material, wherein said substrate has a fifth thermal coefficient of expansion (CTE), said chip having a sixth CTE, said non-organic material and said organic material having a seventh CTE and a eighth CTE, respectively, wherein said eighth CTE is greater than said fifth CTE, said fifth CTE being greater than said seventh CTE, said seventh CTE being greater said sixth CTE.

* * * * *